United States Patent [19]

Nakano et al.

[11] Patent Number: 5,972,802
[45] Date of Patent: Oct. 26, 1999

[54] PREVENTION OF EDGE STAIN IN SILICON WAFERS BY OZONE DIPPING

[75] Inventors: Masami Nakano; Jim Woodling, both of Vancouver, Wash.

[73] Assignee: SEH America, Inc., Vancouver, Wash.

[21] Appl. No.: 08/944,542

[22] Filed: Oct. 7, 1997

[51] Int. Cl.$^6$ .......................... H01L 21/31; H01L 21/469
[52] U.S. Cl. .......................... 438/770; 438/476; 438/959; 438/974; 134/902
[58] Field of Search ...................................... 438/476, 690, 438/753, 959, 964, 974, 770; 134/902; 510/174

[56] References Cited

U.S. PATENT DOCUMENTS

| | | | |
|---|---|---|---|
| 5,516,730 | 5/1996 | Saeed | 438/473 |
| 5,626,681 | 5/1997 | Nakano | 134/3 |

FOREIGN PATENT DOCUMENTS

| | | |
|---|---|---|
| 0587889 A1 | 3/1994 | European Pat. Off. . |
| 0 700 077 A2 | 8/1995 | European Pat. Off. . |
| 0708480 A1 | 4/1996 | European Pat. Off. . |
| 708480A1 | 4/1996 | European Pat. Off. . |

OTHER PUBLICATIONS

Ozonized Ultrapure Water Treatmant of Organic Contamination of Si–Wafer Surface; Proceedings—Institute of Environmental Sciences, p. 380–385 (1993).

*Primary Examiner*—Charles Bowers
*Assistant Examiner*—Nema Berezny
*Attorney, Agent, or Firm*—Alston & Bird LLP

[57] ABSTRACT

A method of preventing edge stain in silicon wafers from the edge polishing step with an alkaline slurry, the method consisting of formation of an oxide layer by an ozone dipping step prior to edge polishing.

6 Claims, No Drawings

PREVENTION OF EDGE STAIN IN SILICON WAFERS BY OZONE DIPPING

BACKGROUND OF THE INVENTION

Production of silicon wafers for the manufacture of semiconductor chips requires that the wafer be ground to an exact diameter and that the periphery or outer edge of the wafer be defect-free down to a microscopic level. As part of the production process, a wafer is typically provided with a chamfer on its outer edge to reduce stress on the edge, which in turn helps prevent chipping and cracking of the wafer. The wafer also typically receives a chemical etch, followed by high temperature annealing in an inert gas atmosphere, such as nitrogen. However, the chemical etch step typically leaves a somewhat roughened surface on the chamfered edge of the wafer. Recently, particularly in the production of large diameter wafers, the wafers have been edge polished with standard polishing slurry solutions to smooth out the roughened chamfered edge resulting from the etching, and further to reduce stress caused by edge grinding to the precise diameters required. Edge polishing results in a mirror-like surface that resists adhesion of contaminating particulates.

However, such edge polishing is by means of an aqueous alkaline colloidal silica-containing slurry which provides the abrasive for the polishing process. This alkaline slurry occasionally splashes on to the surface of the wafer, causing a modest degree of unwanted etching both on the wafer surface and on the edge of the wafer, and becomes especially noticeable over time as evaporation of water in the slurry increases the concentration of caustic in the slurry. When the resulting unwanted etching is visible by halogen light inspection, the wafer is rejected as unacceptable product for so-called "edge stain," a micro-defect on the surface of the wafer that appears as microscopic pitting.

Chemical cleaning of silicon wafers by an aqueous ammoniacal solution, commonly referred to as an "SC-1" cleaning is known to be effective in preventing edge stain. However, SC-1 solutions are expensive and such a process step requires subsequent chemical and waste water treatment.

Although it is well known that a silicon oxide layer may be formed on wafers by exposing them to oxygen at elevated temperatures (McGuire, *Semiconductor Materials and Process Technology Handbook*, pp. 46–77 (1988)), it is also reported that alkaline impurities such as sodium and potassium salts can diffuse rapidly through the oxide layers so formed, even at low temperature, and accordingly it is recommended that more dense dielectric films such as silicon nitride be used in combination with the oxide to passivate the wafers against such impurities. *Ibid.*, p. 55. Since an edge polishing slurry is alkaline, containing sodium and/or potassium salts, the prior art suggests that formation of a silicon oxide layer on a wafer would be of no value in preventing edge stain.

The present invention eliminates the need for a separate high temperature annealing step and provides a simple and efficient method of preventing edge stain.

BRIEF SUMMARY OF THE INVENTION

The essence of the present invention calls for the provision of a protective oxide layer on a silicon wafer just prior to edge polishing of the wafer by dipping the wafer in ozonated water.

DETAILED DESCRIPTION OF PREFERRED EMBODIMENTS

According to the present invention, and in surprising contrast with prior art teachings to the effect that alkaline impurities such as potassium or sodium salts can penetrate silicon oxide layers, it has been found that unwanted etching from the alkaline slurries used in edge polishing of silicon wafers may be prevented by the formation of an oxide layer on the wafer by dipping the wafer in water that has been charged with ozone.

Preferred conditions for the ozone dipping step are from about 5° C. to about 50° C. for a period of from about a few seconds to about 10 minutes, preferably at least 30 seconds, and with an ozone concentration in deionized (DI) water of from about 0.5 to about 100, preferably at least 3 ppm. Most preferred conditions are about 20° C. for 3 minutes with an ozone concentration of at least 5 ppm. Even though the entire wafer receives a slight oxide coating, there is no need to remove the same.

EXAMPLE

Fifteen CZ-type Boron-doped and etched silicon wafers were divided into 3 batches of 5 wafers each. One batch was subjected to cleaning by hydrofluoric acid (HF); a second batch was subjected to an SC-1 cleaning; and the third batch was treated by the ozone dipping of the present invention. All three batches were then edge polished and inspected for edge stain.

The HF cleaning comprised dipping the batch of 5 wafers in a 5 wt % solution of HF at 25° C. for 3 minutes, then rinsing in DI water, followed by a spin dry. The SC-1 cleaning comprised dipping the batch of 5 wafers in an aqueous SC-1 solution ($NH_4OH:H_2O_2:H_2O=1:1:10$) at 85° C. for 3 minutes, followed by a DI water rinse and spin dry. The ozone dipping took place at 25° C. for 3 minutes, with an ozone concentration of 5 ppm in DI water.

Following the above treatment steps, all batches were edge polished with a standard polishing slurry comprising an aqueous 1 wt % NaOH solution containing colloidal silica (pH 11), then cleaned in the conventional fashion and visually inspected under halogen light for edge stain. All 5 of the HF pre-cleaned wafers showed significant stain after edge polishing, while all of the wafers in the SC-1-treated and ozone-dipped wafers displayed no staining whatsoever, thereby demonstrating that the ozone dipping of the present invention was just as effective in preventing stain as an SC-1 cleaning, but does not require subsequent waste water treatment steps to remove ammonium hydroxide prior to disposal.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A process for edge polishing a wafer comprising the steps:

(a) contacting said wafer with water containing ozone to thereby form an oxide layer; and (b) polishing an edge of said wafer with an aqueous alkaline slurry without subjecting said wafer to a heat treatment process following formation of the oxide layer, wherein contact of said wafer with water containing ozone reduces edge staining of said edge polished wafer.

2. The process of claim 1 wherein step (a) is performed at a temperature of from about 5° C. to about 50° C.

3. The process of claim 1 wherein step (a) is conducted for a period of time of up to about 10 minutes.

4. The process of claim 3 wherein step (a) is conducted for at least 30 seconds.

5. The process of claim 1 wherein step (a) is conducted with an ozone concentration of from about 0.5 to about 100 ppm.

6. The process of claim 5 wherein the ozone concentration flow is from about 5 to about 20 ppm.

\* \* \* \* \*